United States Patent [19]

Freedman et al.

[11] Patent Number: 4,791,376

[45] Date of Patent: Dec. 13, 1988

[54] MULTI-PROBE, HAND-HELD CIRCUIT TESTER

[76] Inventors: Milton W. Freedman, 3309 Iroquois Ave., Long Beach, Calif. 90808; Dan Tucker, 5122 Huntington Dr., Los Angeles, Calif. 90032

[21] Appl. No.: 29,174

[22] Filed: May 15, 1987

[51] Int. Cl.[4] .................................... G01R 31/02
[52] U.S. Cl. .................................. 324/555; 324/119; 324/133; 324/508; 324/556
[58] Field of Search ............... 324/119, 73 R, 149, 324/158 P, 72.5, 133, 508, 555, 556

[56] References Cited

U.S. PATENT DOCUMENTS

| | | | |
|---|---|---|---|
| Re. 31,606 | 6/1984 | Crosby | 324/62 |
| 3,962,630 | 6/1976 | Chaffee | 324/508 |
| 4,015,201 | 3/1977 | Chaffee | 324/556 |
| 4,152,639 | 5/1979 | Chaffee | 324/508 |

*Primary Examiner*—Jerry Smith
*Assistant Examiner*—Stephen M. Baker
*Attorney, Agent, or Firm*—William W. Haefliger

[57] ABSTRACT

A circuit testing device, including a casing having opposite ends, a single probe rigidly projecting from one end of the casing so that the casing may be manipulated to forcibly insert the probe into an electrical power socket, the casing carrying a first socket terminal, and there being a second probe connected with the socket terminal, circuitry in the casing including at least one Zener diode and at least one half wave rectifier interconnecting the single probe and the socket terminal, a presence-of-voltage circuit in the casing and electrically connected with the single probe, the circuit including a presence of voltage indicator and rectifier and amplifier elements electrically connected between the single probe and the indicator, the rectifier element including a rectifier bridge having two terminals connected across the Zener diode, there also being a voltage level indicating meter connected in series with such circuitry.

6 Claims, 3 Drawing Sheets

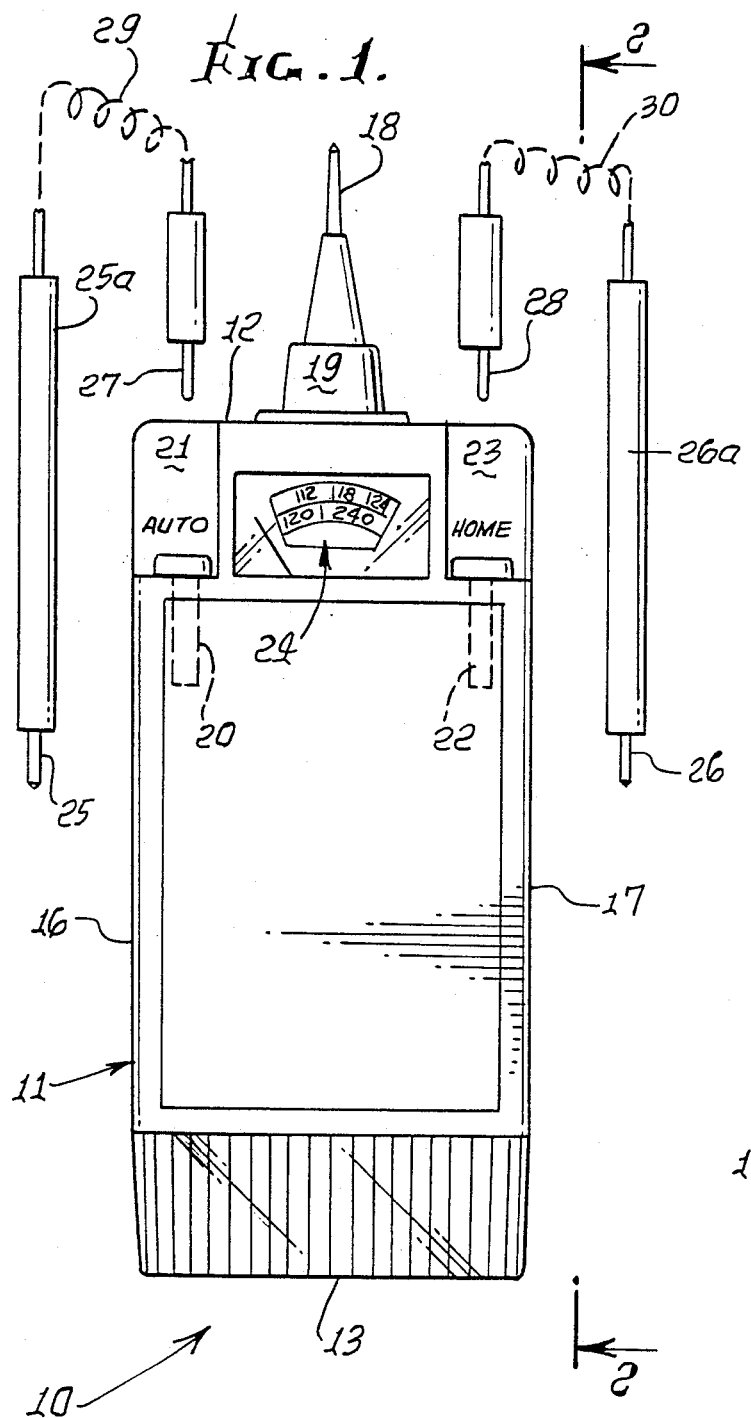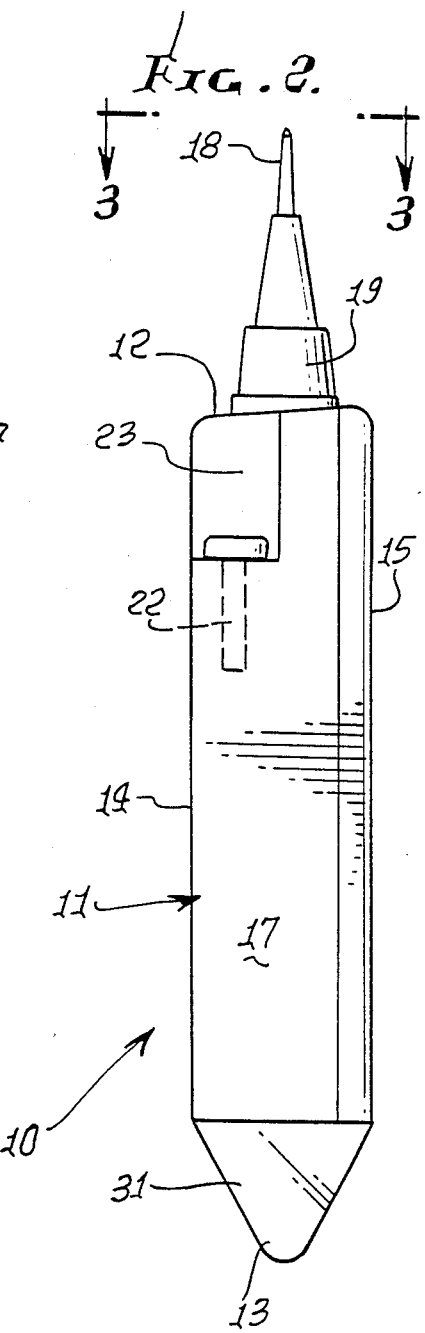

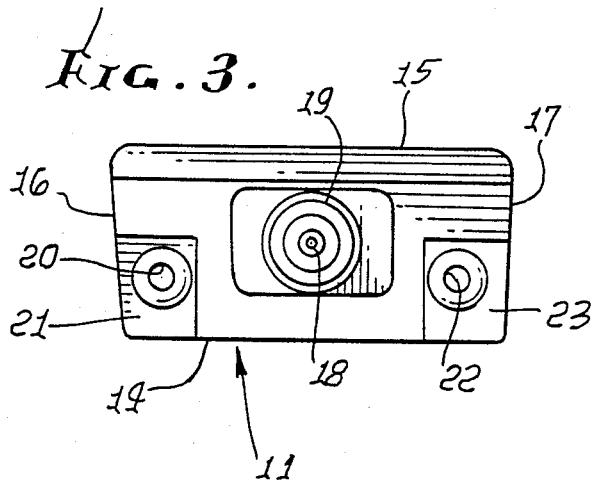
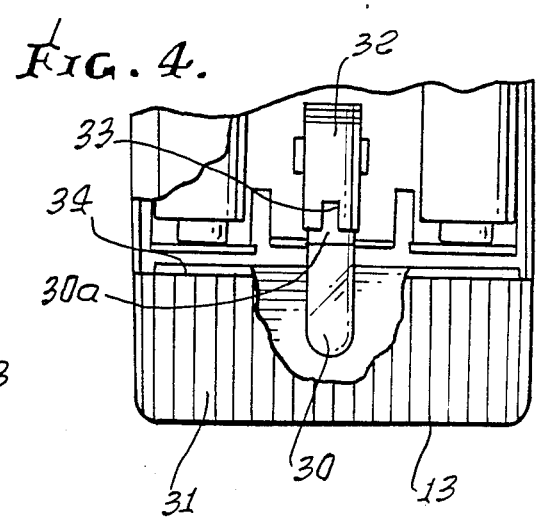
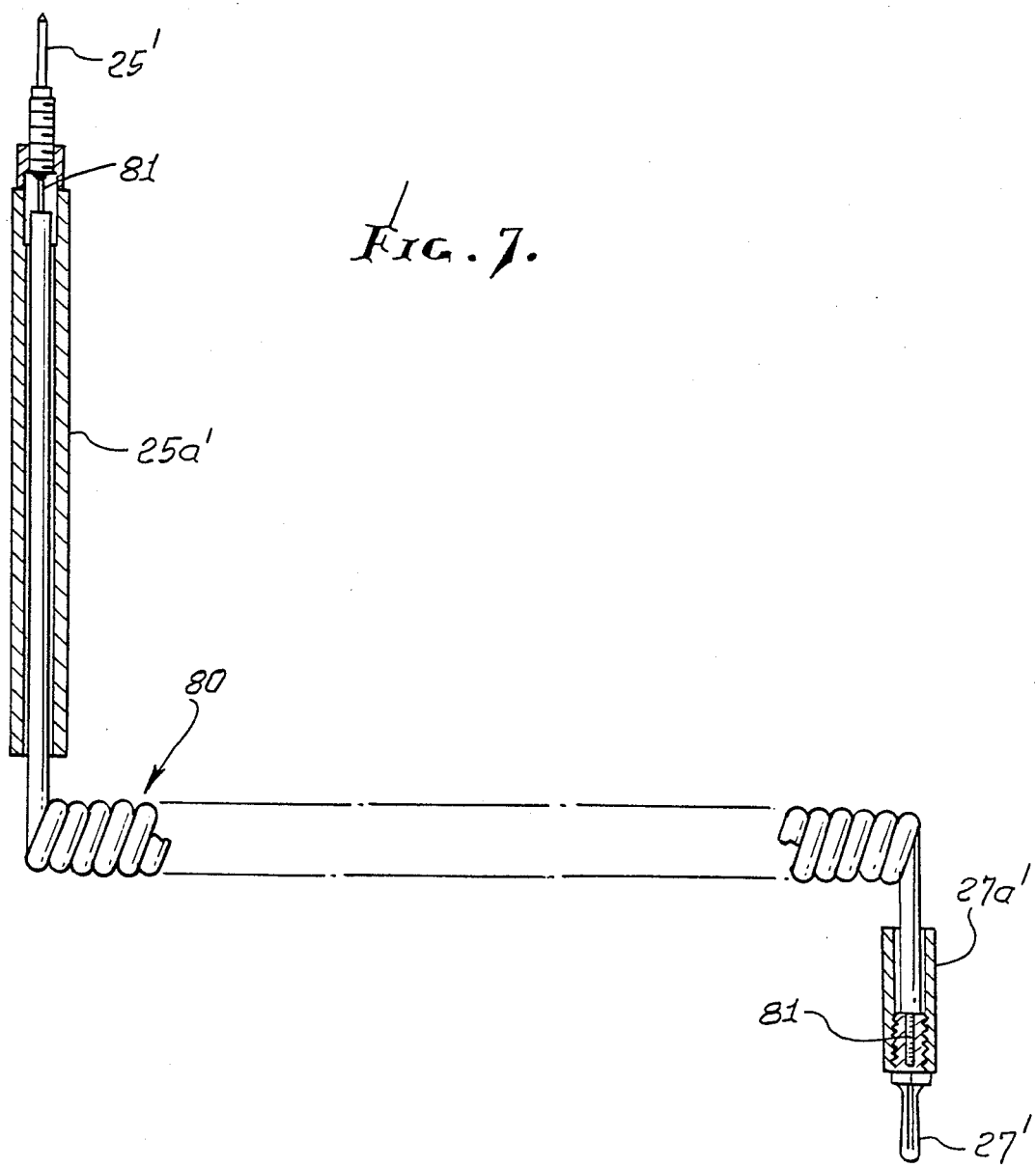

MULTI-PROBE, HAND-HELD CIRCUIT TESTER

BACKGROUND OF THE INVENTION

This invention relates generally to circuit testing devices, and more particularly concerns apparatus to test for presence of voltage, and also for voltage level and electrical continuity. The invention enables the use of a single tester probe to test for presence of voltage and voltage level, and two tester probes to test for continuity, no switching devices being required and with the further advantage that no damage or injury can occur to the device or the user. The presence of 120, 220, and 440 volts as in homes, and 12, 18 and 24 volts as in autos and other devices can be determined using a single probe, with sound or light indicators being activated, the use of a neutral or ground not being required.

There is need for circuitry to quickly locate a defective engine spark plug, especially when the engine is not running. Further, as regards homes, electrical contractors and electricians must frequently determine whether or not voltage is present at a terminal, lead or line, as for example 120, 240, or 480 volts. If the outlet or terminal being tested is difficult to reach, the running of a separate ground line to accomplish the test becomes very difficult. Such workmen also frequently need to know if there is electrical continuity beteen two terminals; for example, if such continuity is lacking as between neutral and ground terminals at a receptable, there is the possibility of a break in the netural wire. Prior devices for resolving these questions have lacked the many unusual advantages in construction, mode of operation and results as are provided by the present invention.

SUMMARY OF THE INVENTION

It is a major object of the invention to provide a very simple apparatus to test for voltage presence, and also for voltage level and circuit continuity, and overcoming the problems associated with prior devices and providing the advantages referred to. Basically, the device comprises:

(a) a casing having opposite ends, (b) a single probe rigidly projecting from one end of the casing whereby the casing may be manipulated to forcibly insert the probe into an electrical power socket, (c) the casing carrying a first socket terminal and there being a second probe connected with socket terminal, (d) circuitry in the casing including at least one Zener diode and at least one half wave rectifier interconnecting the single probe and said socket terminal, (e) a presence of voltage circuit in the casing and electrically connected with said single probe, said circuit including a presence of voltage indicator means, and rectifier and amplifier means electrically connected between the single probe and the indicator means, the rectifier means including a rectifier bridge having two terminals connected across the Zener diode, (f) there also being a voltage level indicating meter connected in series with said circuitry.

As will be seen, the housing typically has front and rear faces and opposite sides, there being two recesses defined by the housing and adjacent said one end of the housing, the recesses opening at said one end and at said opposite sides, respectively, the single probe carried by the housing to project from said one end of the housing at a location between the recesses; and the second probe is connected via a wire with a jack received in said socket and extending in one of the recesses. The meter is typically and advantageously located between the recesses, and there being a second socket carried by the casing and a third probe that is connected via a wire with a jack received in the second socket and extending in the other of the recesses. The second probe is usable for testing automoblie or vehicle battery voltage (DC); and the third probe is used to test house or building line voltage. Location of a defective spark plug is made simple by the invention, and involves placing one probe in contact with the engine metal to act as ground; the second probe is then placed in contact with the tip of the spark plug after removal of the plug wire cap. If the plug is defective, it will activate the tester, visually and audibly, the motor being "off", which allows testing with complete safety. Automotive condensers can also be tested, by application of both probes. The tester will emit light and sound for 5 to 10 seconds, but if such continues for much beyond 10 seconds, the condenser is faulty and should be changed.

DRAWING DESCRIPTION

FIG. 1 is a frontal view of a test device;
FIG. 2 is a side view on lines 2—2 of FIG. 1;
FIG. 3 is a view on lines 3—3 of FIG. 2;
FIG. 4 is a fragmentary view of a bottom portion of the FIGS. 2 and 3 device;
FIGS. 5 and 6, are circuit diagrams, and
FIG. 7 ,is an extendsible cord probe assembly.

DETAILED DESCRIPTION

Figure 5:
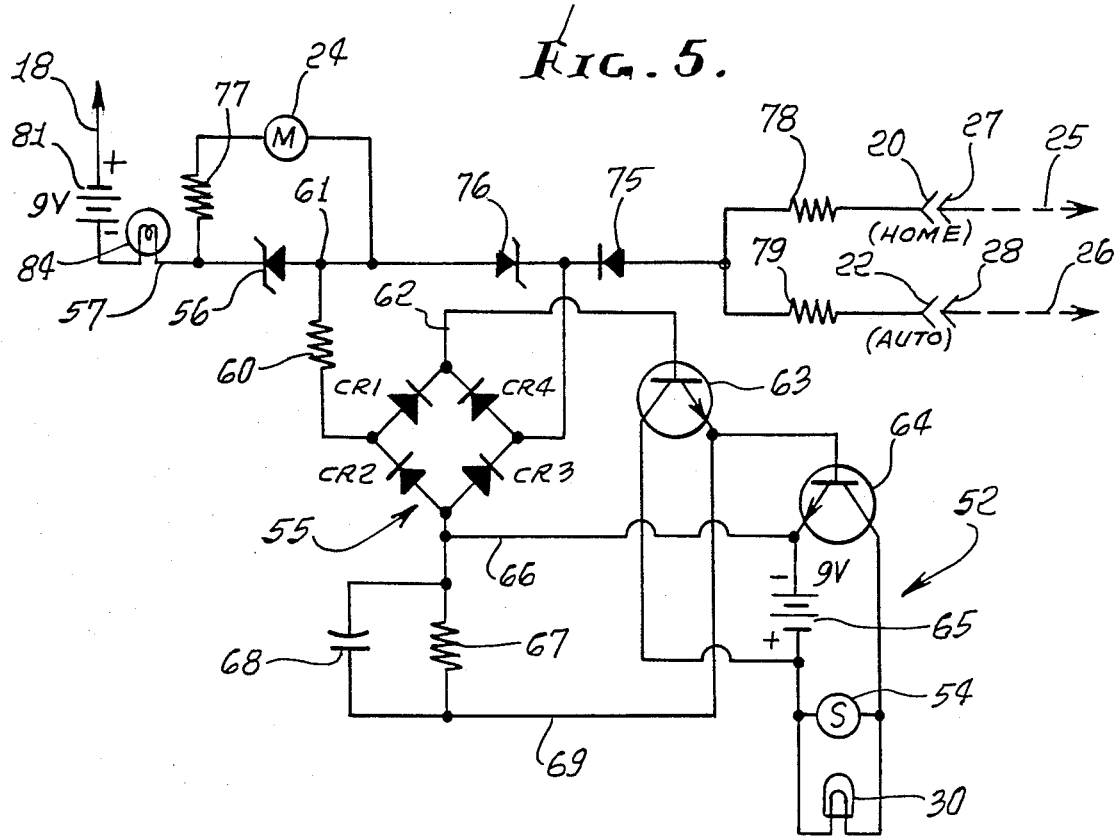

In FIGS. 1–4, a hand-held circuit testing device 10 includes an elongated casing 11 having opposite ends 12 and 13, front and rear faces 14 and 15, and opposite sides 16 and 17. A single probe 18 carried by the casing is adapted to be inserted into an electrical socket, as for example to detect voltage of 120 or 240 volts, eliminating need for a separate ground or neutral test lead. The probe is spaced from the hand-held body or casing as by an elongated probe mount 19 on the upper end of the casing.

The casing also carries a first socket terminal 20 at the bottom of a first recess 21 formed by the casing, and a second socket terminal 22 at the bottom of a second recess 23 formed by the casing. A voltage level meter 24 is located on the casing, between these two recesses. Second probe 25 and third probe 26 are connected with the socket terminals 20 and 22 respectively, as via plugs 27 and 28 removably insertible in those sockets. The plugs are connected with the probes 25 and 26 as via cables 29 and 30; and elongated rigid mounting stems 25a and 26a mount the probes 25 and 26. In use, plug 27 is insertible into socket 20, and probes 18 and 25 are used to detect circuit continuity in an automobile circuit, such as for spark plugs, voltage levels 12V, 18V, or 24V (DC) then appearing on the meter upper band, as shown; alternatively, plug 28 is insertible into socket 22, and probes 18 and 26 are then used to detect circuit continuity in a home wiring circuit, voltage levels 120V or 240V (AC) then appearing on the meter lower band, as shown. Note labeling of the two recesses as "AUTO" and "HOME". The recesses intersect the front of the casing and its opposite sides, as shown, for ease of use of the plugs.

FIG. 4 shows provision of a light or lamp 30 at the lower end of the casing, as in a protective translucent or transparent U-shaped cap 31. A mount for the lamp is indicated at 32, with U-slot pin connection at 33 of the lamp base 30a to the mount, within the casing. Cap 31 is snap-in edge removable from the casing, at 34. It is wide, and away from the hand-held body of the casing, so that the user's hand cannot obstruct the glow of lamp 30.

Circuitry in the casing as seen in FIG. 5 may be used to test for three circuit conditions.

The device incorporates a presence-of-voltage circuit within the casing and electrically connected with the probe. The latter circuit, indicated generally at 52 includes a presence-of-voltage indicator such as light 30 and/or sounder 54; also, the circuit includes rectifier means as at 55 and amplifier means electrically connected between the probe and indicator, whereby when probe 18 is applied to a terminal to which power (as for example at 120 or 240 or 440 volts) is supplied, the light 30 will glow and/or sounder 54 will sound. In this regard, note the provision of a Zener diode 56 in path 57 to which probe 18 is connected. The Zener may for example establish a voltage level of 6.2 volts. Rectifier means 55 may comprise a diode bridge. Resistor 60 is connected between point 61 and the bridge. The bridge output at 62 is applied to the amplifier means, which typically comprises first and second Darlington amplifier stages. The latter are shown to include first and second transistors 63 and 64, each having base, collector and emitter terminals as shown. The base electrode of the first transistor 63 is connected to the bridge output 62, and the base electrode of the second transistor 64 is connected to one of the collector and emitter terminals(the emitter, as shown) of transistor 63. Battery 65 is typically connected to electrodes of both transistors, and is also connected in series with indicators 30 and 54 and between the collector and emitter terminals of transistor 63 and of transistor 64. The negative side of the battery is connected via path 66 with the diode bridge 55, as shown. Bias resistance and capacitance appear at 67 and 68 between paths 66 and 69.

There may also be an electrical continuity testing circuit and voltage level testing opeatively connected with the probe 18, via the Zener 56. That circuit is shown to include auxiliary probe 25 or 26, as referred to, as well as half wave rectifier or diode 75 and Zener 76 in back-to-back series with Zener 56, battery 81, and probe 18. Meter 24 and resistor 77 are connected in parallel with Zener 56. Note also protective resistors 78 and 79. A lamp 84 may be included in the series circuit to light when continuity of an external circuit between probes 18 and 25 exists.

Representative values for the circuit elements are as shown below:

| | | | |
|---|---|---|---|
| battery | 81 | 9 | volts |
| " | 65 | 9 | volts |
| resistance | 78 | 220K | ohms |
| " | 79 | 51K | ohms |
| " | 60 | 2 | megohms |
| " | 67 | 4.7K | ohms |
| " | 77 | 330 | ohms |
| capacitance | 68 | 50 | mfd |
| transistor | 63 | | 2N6426 |
| " | 64 | | 2N6426 |
| diode | 75 | | 1N4003 |

Figure 6:
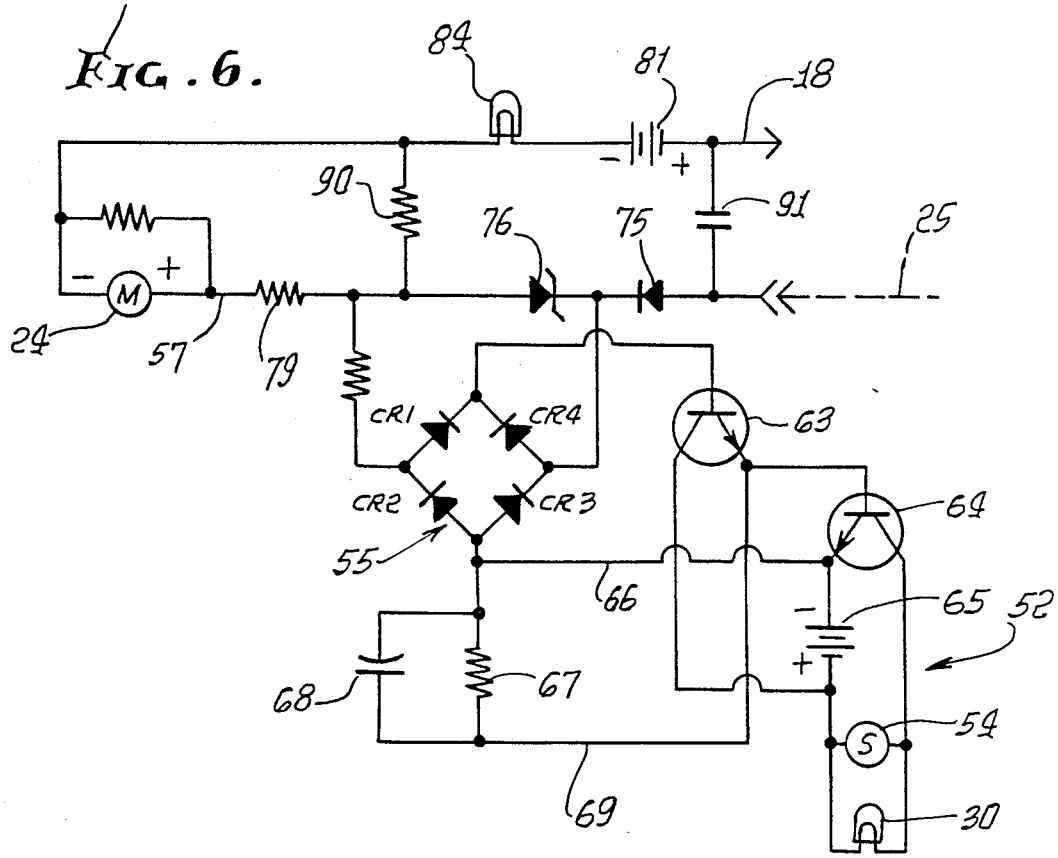

Elements of the alternative circuit seen in FIG. 6 which are the same as those of FIG. 5 bear the same numbers. In this example, probe 26 is omitted. Protector resistor 90 (6K ohms) and capacitor 91 (0.001 mfd) are added.

On a non-grounded fuse block, it is simple to determine with the single probe which is the load wire, and which is the neutral. Fuse testing is made extremely simple by touching the probe to the line side of the fuse and the load side of the fuse. When testing a fuse block or circuit breakers, it is only necessary to touch the load size of the fuse or breaker when the line side is connected to a bus bar. It is not necessary to look at the tester to detemine a voltage indication, as the sound indication will indicate voltage.

Further, when installing a three wire service and one is ready to hook up temporarily to the two wire service, one must determine which is the hot wire coming from the pole. The device will determine the "hot" line. To determine which of the three wires coming from the new service stack is the neutral, one merely uses the continuity probes, touching the stack (ground) with probe 18 and with the other probe 25 checking each new lead until a sound is heard which indicates that particular wire is the neutral, since it is forming a complete circuit from the neutral bus bar around the the grounded stack. When one is working in broad day light, it is a great convenience not to have to look for a light indication, knowing that the sound indicator indicates that voltage or continuity is present.

Other applications include establishing neutrals; ground; motors; controls; relays; primary and secondary sides of transformers for voltages and continuity; continuity phasing pairs in motors for 120, 204, and 480 volts; switchboard tests for low and high voltage; relays, low and high voltage; telephones, testing systems via sound and single probe; testing single phase and three phase windings of motors.

The device is usable when no ground is available, and an outlet terminal (which may be quite inaccessible as in an attic, under a floor, etc.) is not operative. The single probe can then be applied to the terminal or wire to determine if it is "hot".

The meter 24, directly in path 57 enables voltage level checking, at all times, whatever probes are employed.

In FIG. 7, an extensible coiled cord 80 includes wire 81 connected with plug 27' and probe 25'. Hodlers 25a' and 27a' mount 25 and 27, respectively and pass the cord as shown. This allows remote application of probe 25' to a test circuit.

We claim:
1. In a circuit testing device, the combination comprising:
 (a) a casing having opposite ends,
 (b) a single probe rigidly projecting from one end of the casing whereby the casing may be manipulated to forcibly insert the probe into an electrical power socket,
 (c) the casing carrying a first socket having a terminal and there being a second probe operative connected with the socket terminal,
 (d) circuitry in the casing including at least one Zener diode and at least one half wave rectifier interconnecting the single probe and said socket terminal,
 (e) a presence of voltage circuit in the casing and electrically connected with said single probe, said circuit including a presence-of-voltage indicator means and rectifier and amplifier means electrically connected between the single probe and the indicator means, the rectifier means including a rectifier bridge having two terminals connected acros the Zener diode, (f) there also being a voltage level indicating meter connected in series with said circuitry, (g) said casing also having front and rear faces and opposite sides, there being two recesses defined by the casing and adjacent said one end of the casing, said recesses opening at said one end and at said opposite sides respectively, said single probe carried by the casing to project from said one end of the casing at a location between said recesses, (h) said second probe connected via a wire with a jack received in the first socket and extending in one of the recesses, the first socket carried by the casing, (i) said meter being located between said recesses, and there being a second socket carried by the casing and a third probe that is connected via a wire with a jack received in the second socket and extending in the other of the recesses.

2. The combination of claim 1 wherein said amplifier means includes first and second Darlington amplifier stages electrically connected between the rectifier means and the indicator, said first and second stages comprising first and second transistors each having base, collector and emitter electrodes, the first transistor base electrode electrically connected with a third terminal of the rectifier means, the second transistor base electrode electrically connected with one of the emitter and collector electrodes of the first transistor, there being a battery connected in series with the indicator, the battery and indicator connected between the collector and emitter electrodes of the second transistor.

3. The combination of claim 1 wherein the indicator means comprises a light located at the opposite end of the casing.

4. The combination of claim 3 wherein the casing includes a transparent portion at said opposite end of the casing, and containing said light.

5. The combination of claim 1 wherein said wires are slack wires.

6. In a circuit testing device, the combination comprising:

(a) a casing having opposite ends, (b) a single probe rigidly projecting from one end of the casing whereby the casing may be manipulated to forcibly insert the probe into an electrical power socket, (c) the casing carrying a first socket and there being a second probe connected with the first socket, (d) circuitry in the casing including at least one Zener diode and at least one half wave recitifier interconnecting the single probe and said socket terminal, (e) a presence of voltage circuit in the casing and electrically connected with said single probe, said circuit including a presence-of-voltage indicator means and rectifier and amplifier means electrically connected between the single probe and the indicator means, the rectifier means including a rectifier bridge having two terminals connected across the Zener diode, (f) there also being a voltage level indicating meter connected in series with said circuitry, (g) the indicator means comprising a light located at the opposite end of the casing, said indicator means also including a buzzer in the casing, (h) the casing defining two recesses at said one end of the casing, the single probe projecting away from a location between the recesses, (i) said first socket located at one of the recesses, and there being a second socket located at the other recess, the sockets adapted to receive jacks connected via wires with second and third probes, (j) the meter located generally between the recesses.

* * * * *